United States Patent [19]
Miyata et al.

[11] Patent Number: 6,053,745
[45] Date of Patent: Apr. 25, 2000

[54] CARD CONNECTOR AND HOLDER SPACE PRODUCING FEATURES AND AN ELECTRONIC APPARATUS HAVING THE SAME

[75] Inventors: Akio Miyata, Tondabayashi; Toshiyasu Ito, Togane, both of Japan

[73] Assignee: Minolta Co., Ltd., Osaka, Japan

[21] Appl. No.: 08/921,449

[22] Filed: Aug. 29, 1997

[30] Foreign Application Priority Data

Aug. 30, 1996 [JP] Japan ................................. 8-248540
Feb. 20, 1997 [JP] Japan ................................. 9-036062

[51] Int. Cl.[7] .................................................. H01R 9/09
[52] U.S. Cl. ............................................. 439/64; 439/931
[58] Field of Search .......................... 439/630, 64, 931; 235/441

[56] References Cited

U.S. PATENT DOCUMENTS 4,629,270 12/1986 Andrews ................................. 439/630
5,052,936 10/1991 Biechler et al. ...................... 439/630
5,364,275 11/1994 Ota et al. ................................. 439/65

FOREIGN PATENT DOCUMENTS 2-20837 6/1990 Japan .
6-110581 4/1994 Japan .
6-349548 12/1994 Japan .

OTHER PUBLICATIONS

Yamaichi Electronics Co., Ltd., Catalog of CN 015 Series, issued in Nov., 1996.
Yamaichi Electronics Co., Ltd., Catalog of CN 015 Series, issued in Aug., 1997.

*Primary Examiner*—Neil Abrams
*Assistant Examiner*—Javaid Nasri
*Attorney, Agent, or Firm*—Sidley & Austin

[57] ABSTRACT

In a card connector and an electronic apparatus having the same, installation parts with which the card connector is installed at a predetermined distance apart from a printed circuit board, are arranged inside a projected area of a card holder body. Therefore, the installation parts do not interfere with electronic parts mounted in a body of the electronic apparatus, which makes it possible to further miniaturize the body of the electronic apparatus. Moreover, a mounting space of the printed circuit board can be efficiently used by installing the card holder body at the predetermined distance apart from the printed circuit body.

18 Claims, 8 Drawing Sheets

CARD CONNECTOR AND HOLDER SPACE PRODUCING FEATURES AND AN ELECTRONIC APPARATUS HAVING THE SAME

BACKGROUND OF THE INVENTION

This invention relates to a card connector which has a card insertion slot and contacts which are electrically connected to a inserted card, and an electronic apparatus having the same.

Conventionally, in an electronic apparatus such as an image photographing apparatus, an IC card has been used for recording image data. The IC card is inserted into a card holder body of a card connector located inside the electronic apparatus, and so electrically connected. In the above-mentioned card connector, installation parts with which the card connector is installed in a body of the electronic apparatus, are arranged outside the projected area of the card holder body, that is, in a position outside a side surface of the card holder body, in order not to interfere with the inserted card.

However, in the structure of the above-described card connector, since the installation parts are arranged outside the projected area of the card holder body, they may interfere with other electronic parts in the case of mounting them in a small space inside a miniaturized electronic apparatus. This has caused a problem for miniaturizing the electronic apparatus. Besides, it has been requested that the mounting space of the printed circuit board should be efficiently used by installing the card holder body at a predetermined distance apart from a printed circuit board (so-called standoff) in order to make a space to mount chips, etc. between the card holder body and the printed circuit board.

SUMMARY OF THE INVENTION

This invention is made to solve the above-mentioned problems. An object of the present invention is to provide a card connector and an electronic apparatus having the same, wherein the installation parts do not interfere with other electronic parts in a miniaturized body of the electronic apparatus, which contributes to the miniaturization of the apparatus. Another object is to provide a card connector and holder for an electronic apparatus having the same, wherein a card holder body is installed at a predetermined distance apart from a printed circuit board, which makes it possible to efficiently use a mounting space of the printed circuit board.

The above-mentioned objects are achieved by the present invention which is characterized by a card connector comprising a card holder body which has a card insertion slot into which a card is inserted, and supports the inserted card; and installation parts with which the card holder body is installed in the body of an electronic apparatus at a predetermined distance apart from the printed circuit board. Said installation parts are arranged inside the projected area of the card holder body.

In the above-mentioned structure, since the installation parts are arranged inside the projected area of the card holder body, and not positioned outside thereof, the card connector does not interfere with mounted electronic parts, and can be installed in a narrow space. Moreover, the card holder body is installed at a predetermined distance apart from the printed circuit board so that the mounting area of the printed circuit board can be efficiently used.

The present invention is further characterized by the electronic apparatus comprising a body; a printed circuit board which is fixed to the card connector body and upon which electronic parts are mounted; installation parts which are formed unitedly with the card connector, and with which the card connector is installed at a predetermined distance apart from the printed circuit board; and screw members which pass through the printed circuit board. Each of said installation part has at least one screw hole into which said screw members engage.

DETAILED DESCRIPTION OF THE PREFERRED EMBODIMENT OF THE PRESENT INVENTION

Figure 1:
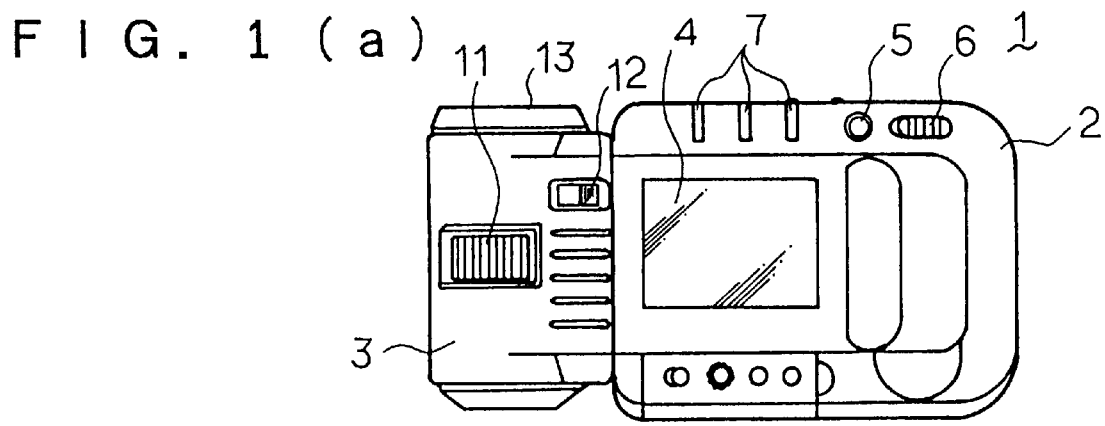
FIGS. 1(a), 1(b), 1(c) and 1(d) are a rear view, a front view, a plan view and a side view of a digital camera according to one embodiment of the present invention respectively.
Figure 1:
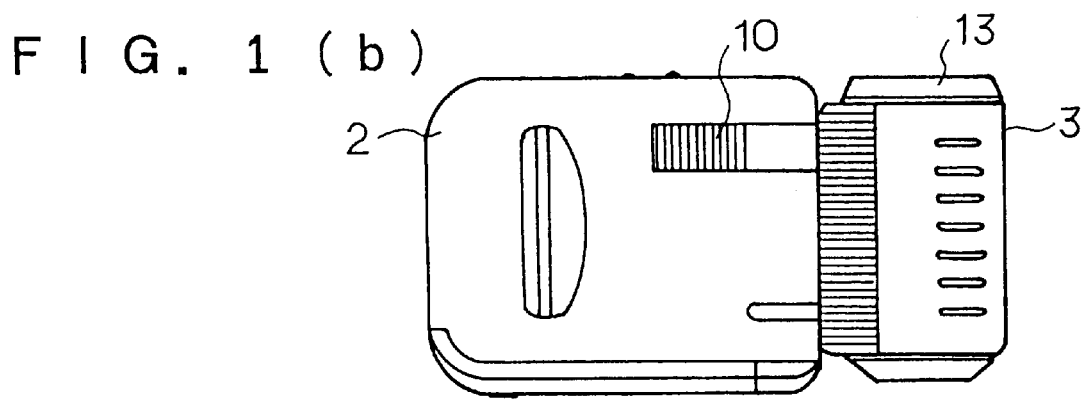
Figure 1:
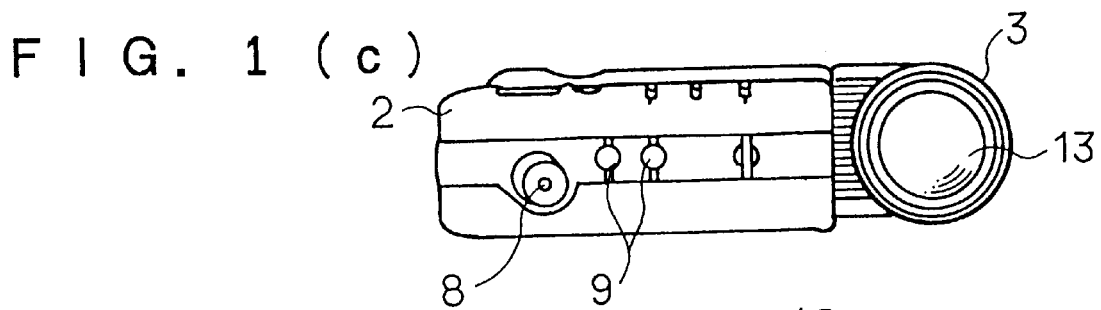
Figure 1:
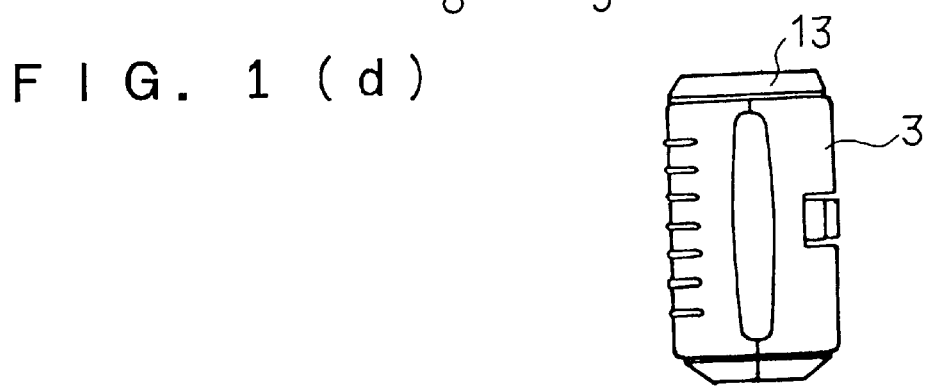

Referring now to the drawings, FIGS. 1(a), 1(b), 1(c) and 1(d) show a digital camera 1 according to one embodiment of the present invention, which includes a body 2 and a photography lens unit (hereinafter referred to as lens unit) 3. The lens unit 3 is rotatably set up with being attachable and removable to a side surface of the body 2. The body 2 comprises on its back surface, a liquid crystal display monitor (hereinafter referred to as LCD monitor) 4 for displaying a photographed image, a main switch 5, a photographing/playback changeover button 6 and a mode changeover button 7, and also has on its upper surface, a shutter button 8 and a frame-by-frame advancing button 9, and besides has a flash lamp 10 on its front surface. The lens unit 3 includes a zooming lever 11 and a lens unit removing lever 12. When the apparatus is not in use, the lens unit 3 is made to be parallel to the body 2, and a photography lens 13 faces upward. On the other hand, when the apparatus is in use for photographing, the lens unit 3 can be rotated 90 degrees relative to the body 2.

As shown in FIGS. 2(a) and 2(b), external connecting terminals such as a DC power input terminal 16 and a digital input/output terminal 17 are arranged on a side surface 15 of the body 2 which faces against the lens unit 3. These external connecting terminals come to appear when the lens unit 3 is rotated 90 degrees in a photographing operation. On the other hand, they do not come to appear when the lens unit 3 is paralleled to the body 2.

Figure 3:
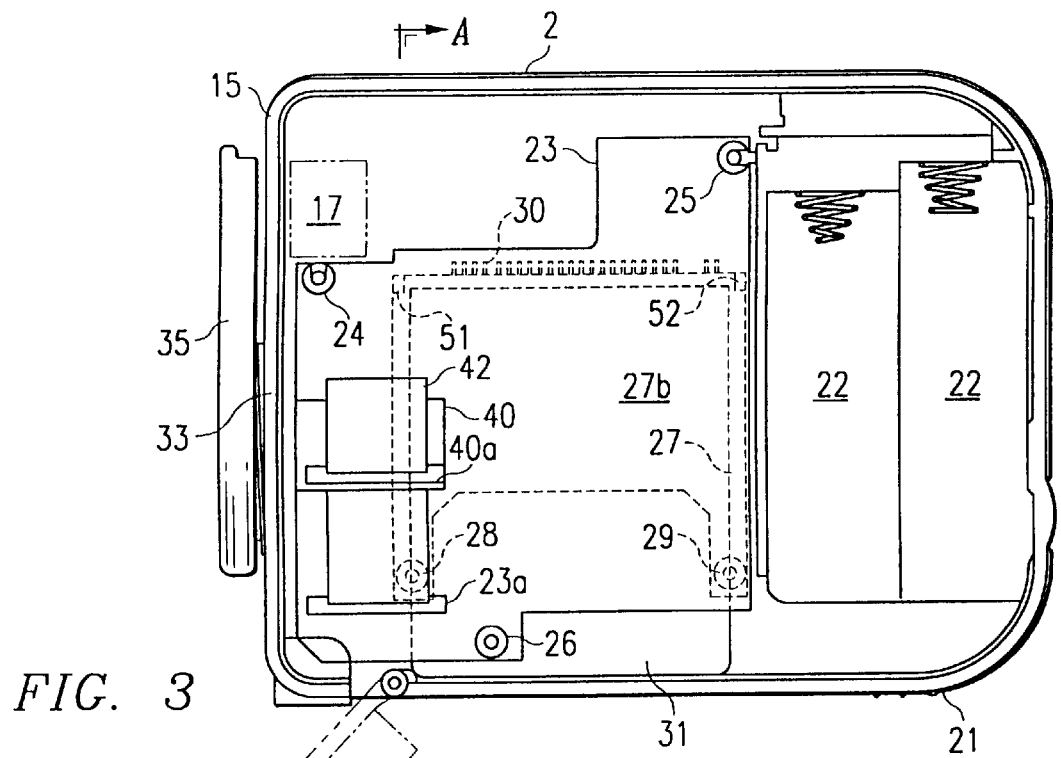
FIG. 3 is a rear view of a body of the apparatus in a state that a photography lens unit and a rear cover are removed.
Figure 4:
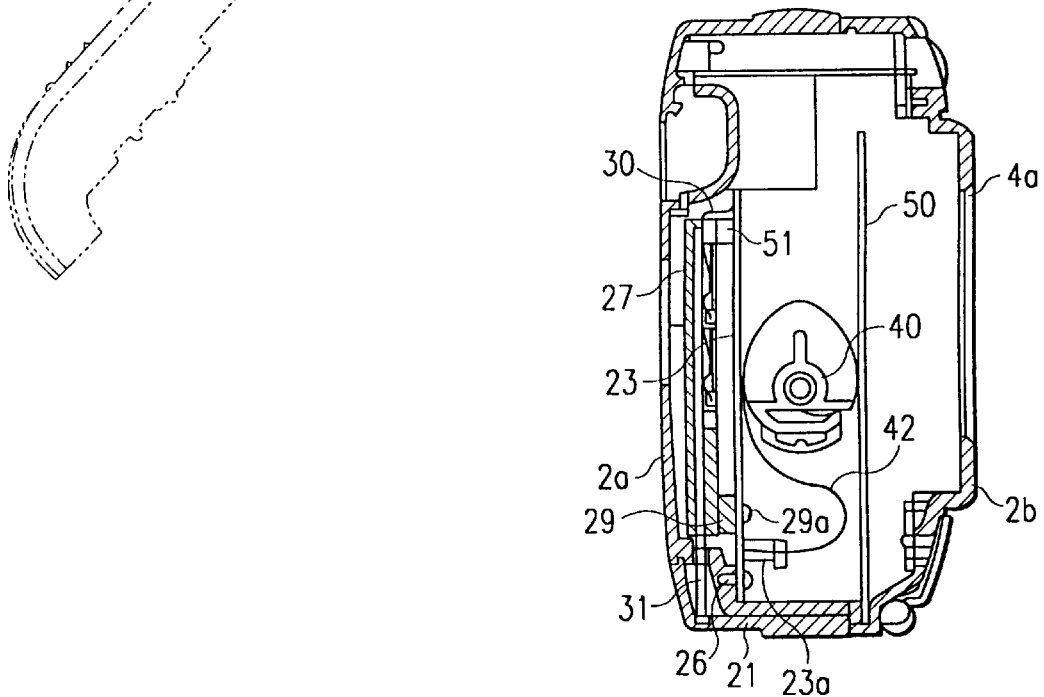
FIG. 4 is a cross-sectional view taken on line A—A of FIG. 3.
Figure 5:
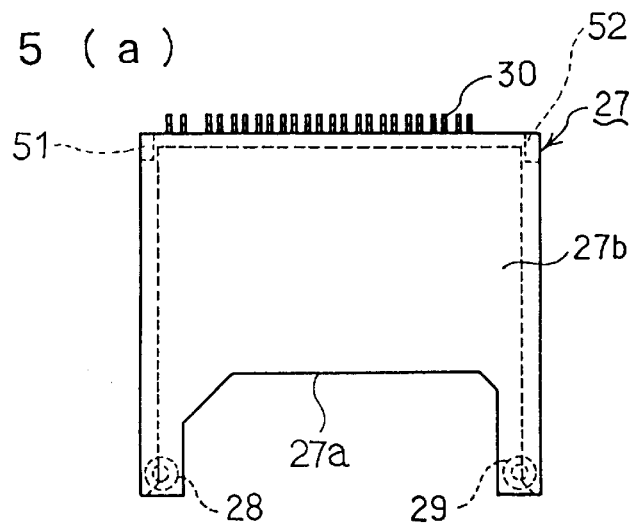
FIGS. 5(a), 5(b), 5(c) and 5(d) are views showing a card connector arranged inside the body.
Figure 5:
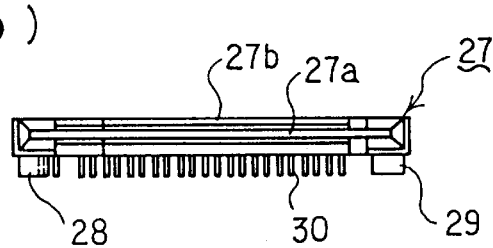
Figure 5:
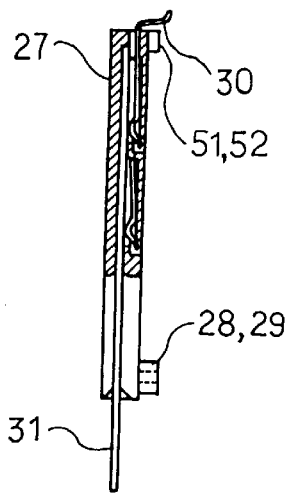
Figure 5:
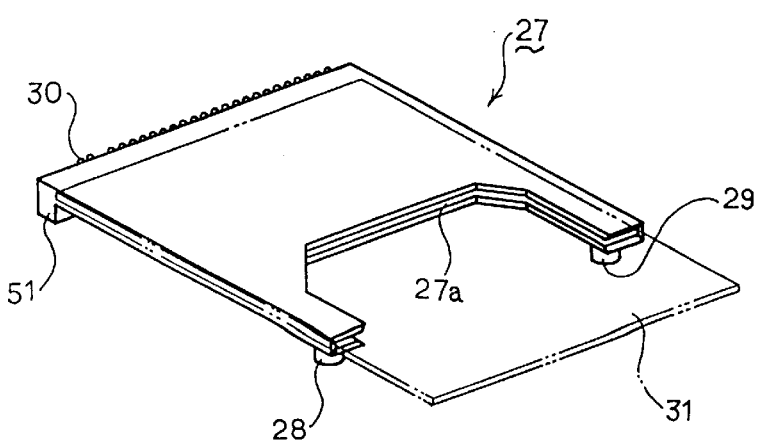

FIG. 3 is a rear view of the body 2 from which the lens unit 3 and a rear cover are removed. FIG. 4 is a cross-sectional view taken on line A—A of FIG. 3. FIGS. 5(a), 5(b), 5(c) and 5(d) are a top view, a front view, a side sectional view, and a perspective view of a card connector 27 which is arranged inside the body 2 (FIGS. 5(c) and 5(d) also show a card 31). As shown in these figures, the body 2 comprises at its bottom side a battery lid 21 which is rotated to open and close, and a battery chamber 22 inside thereof. The body 2 consists of a front cavity 2a and a rear cover 2b, and contains a solid printed circuit board 23 upon which chip parts are mounted, and which is secured by boss parts 24, 25 and 26 on the front cavity 2a. The card connector 27 (often referred to as card holder) is connected to the printed circuit board 23. On the other hand, the rear cover 2b is provided with another solid printed circuit board 50 upon which the LCD monitor 4 and the chip parts are mounted. The LCD monitor 4 can be seen through a LCD opening 4a.

As shown in FIG. 3, FIG. 4 and FIGS. 5(a)–5(d), the card connector 27 consists of a card insertion slot 27a into which an electronic memory card 31 for recording photographed image data, etc. is inserted, and a card holder body 27b which has contacts 30 electrically connected with the card 31 which is inserted into the card insertion slot 27a. The card connector 27 comprises installation parts (stand-off parts) 28, 29, 51 and 52 for mounting the card holder body 27b at a predetermined distance apart from the printed circuit board 23. The installation parts 28 and 29 located on a side of the card insertion slot 27a, are arranged inside a projected area of the card holder body 27b such that the inserted card 31 vertically overlaps these installation parts. The card connector 27 is fastened at the side of the card insertion slot 27a by engaging a screw 29a into the screw hole of installation parts 28 and 29 through the printed circuit board 23 from its surface. The contacts 30 are soldered and connected to a wiring pattern on the printed circuit board 23 at a predetermined distance apart from the card holder body 27b and the printed circuit board 23 by the installation parts 51 and 52. Electronic parts are mounted in the space between the printed circuit board 23 and the card connector 27. Opening the battery lid 21, the card insertion slot 27a of the card connector 27 come to appear, and at the same time, contacts arranged on the battery lid 21 are detached from the batteries. The card 31 is inserted in and extracted from the card connector 27 in an insertion/extraction direction of the batteries when the battery connection is cut off by opening the battery lid 21.

Moreover, as shown in FIG. 3, the body 2 comprises a bearing plate 33 on the side surface 15 for rotatably supporting a lens unit 3, and a rotational member 35 which is supported by a bearing of the bearing plate 33 and rotates unitedly with the lens unit 3. The rotational member 35 makes the lens unit 3 capable of being attached and removed, and electrically connects the lens unit 3 with the body 2. Further, the body 2 also includes a flexible circuit 42 (refer to FIG. 4) such as to surround a circumference of an extension member 40 (details are discussed later). The flexible circuit 42 is connected at one end 42b (refer to FIG. 6) to a connector 23a on the printed circuit board 23.

Figure 6:
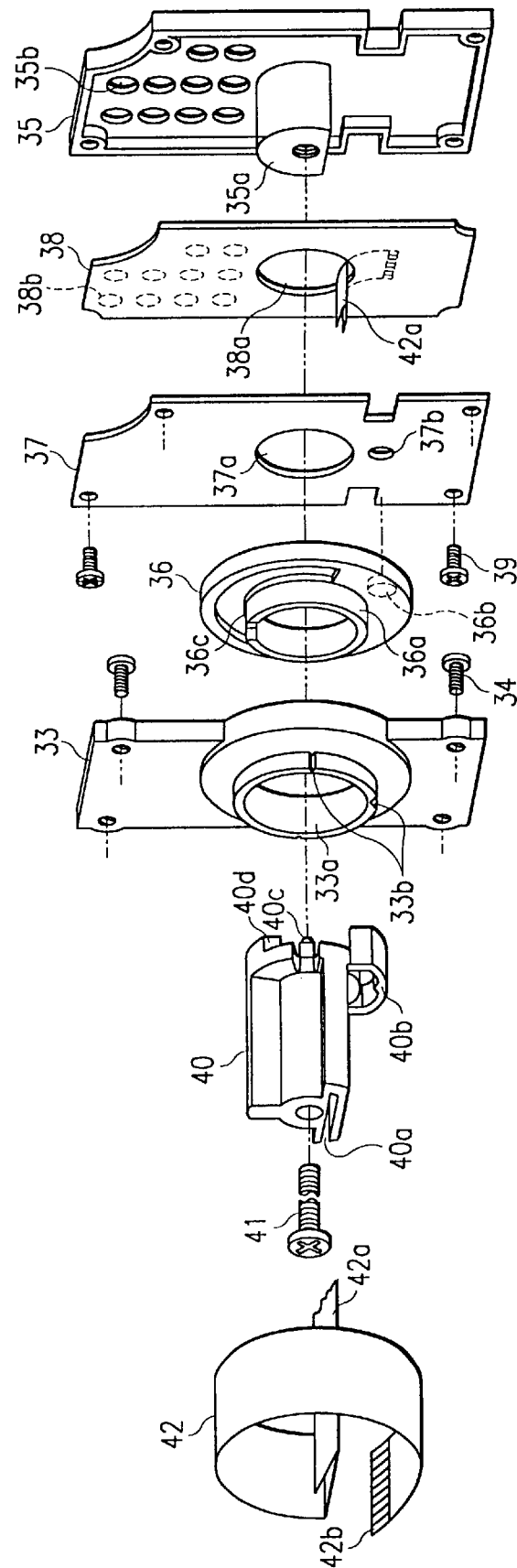
FIG. 6 is an exploded perspective view showing a structure for supporting the photography lens unit rotatably.

FIG. 6 is an exploded perspective view of a structure for rotatably supporting the lens unit 3. The bearing plate 33 is fastened on the body 2 by a screw 34, and a plate's bearing part 33a rotatably supports a shaft part 36a of a shaft member 36. The rotational member 35 has a boss 35a which engages into the inside of the shaft member 36, and is partially cut out (D-shape in cross section) in the shaft direction. The boss 35a is assembled unitedly with the shaft member 36, which forms a whole shaft part having a communicating part. The rotational member 35 is provided with a reinforcing plate 37 and a circuit board 38 having contact plates 38b, which are fastened by screws 39, and besides, the extension member 40 which attaches a side wall of the shaft member 36, and extends into the body to function as a clicking member, is also fixed to the boss 35a by a screw 41 and connected thereto. Thus, the rotational shaft member 36 and the extension member 40 sandwich the fixed bearing plate 33 therebetween from the inside and the outside. The shaft member 36 can be rotated at an angle of predetermined degrees on the bearing plate 33. The above-mentioned rotating movement is given a clicking feeling by a recess 33b and a protrusion 40b, and thrust by a projection 40c. The shaft member 36 and the reinforcing plate 37 stop rotating by an engagement between a projection 36b and a hole 37b. The shaft member 36 and the extension part 40 stop rotating by an engagement between a projection 40d and a notch 36c.

The boss 35a has the D-shape cutout with which the communicating part to the extension member 40 is formed inside the shaft member 36, and the extension member 40 has a notched part 40a which is connected to the communication part in a circumference direction. The flexible circuit 42 which electrically connects the body 2 and the lens unit 3, passes through a hole 38a of the circuit board 38, a hole 37a of the reinforcing plate 37, and further to the communicating part inside the shaft part 36a, then goes out from the notched part 40a in the circumference direction in such a way to surround the extension part 40. The flexible circuit 42 is connected at one end 42a to the terminal of the circuit board 38, while it Is connected at the other end 42b to the connector 23a on the printed circuit board 23 as mentioned previously. The rotational member 35 also has holes 35b which contact plates 38b (refer to following FIG. 7) confront, so that electricity is conducted to the lens unit 3 when it is attached to the rotational member 35.

Figures 7A, 7B:
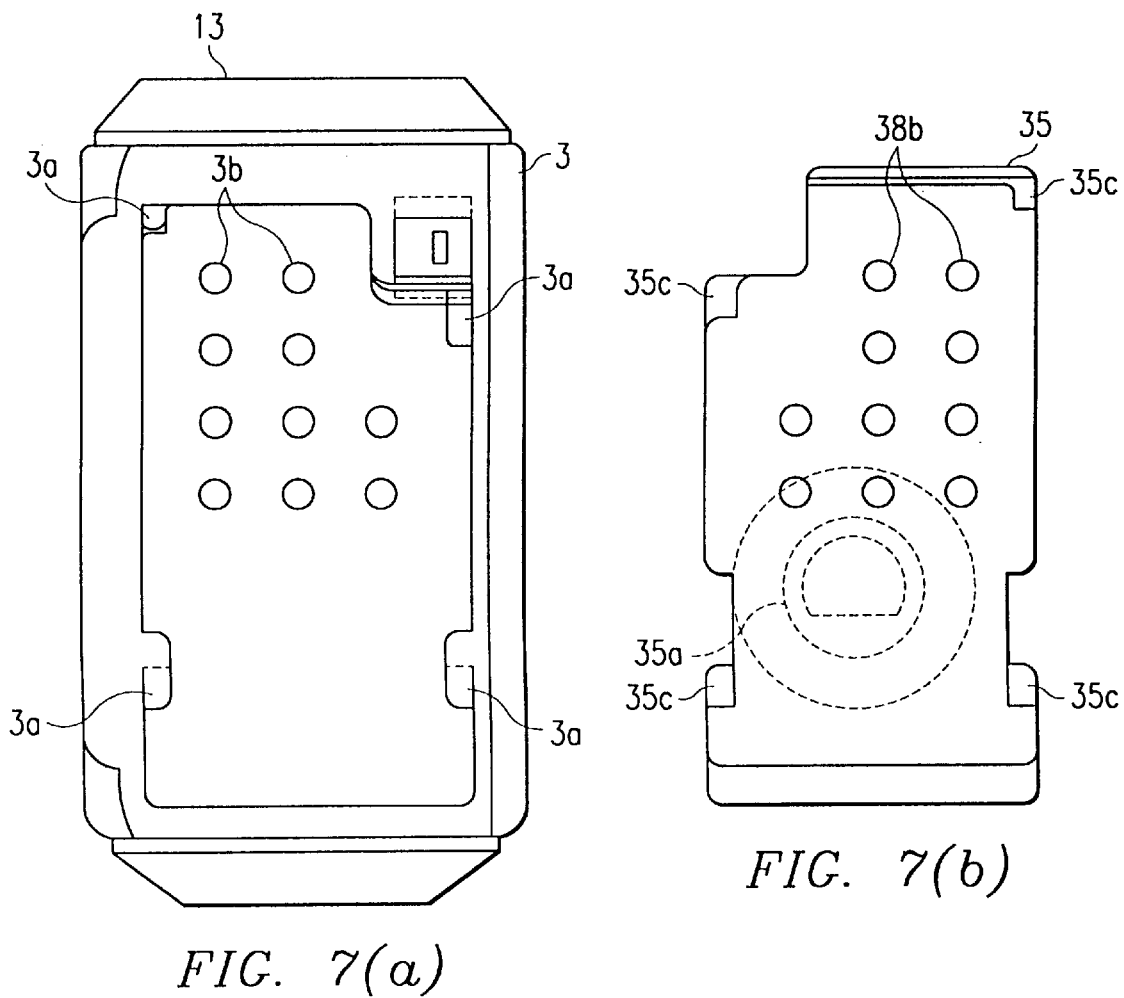
FIGS. 7(a) and 7(b) are a plan view of an attachment surface of the photography lens unit and a projection view of an attachment surface of a rotational member of the body respectively.

FIGS. 7(a) and 7(b) are a plan view of an attachment surface of the lens unit 3 and a perspective view of an attachment surface of a rotational member 35 of the body 2. The lens unit 3 has contact pins 3b facing against the contact plates 38b which confront holes 35b. When the lens unit 3 is attached to the rotational member 35, the contact pins 3b touch with the contact plates 38b, which makes the electric connection therebetween. Moreover, the lens unit 3 has engagement parts 3a which engage with engagement parts 35c arranged in the rotational member 35.

Figure 2:
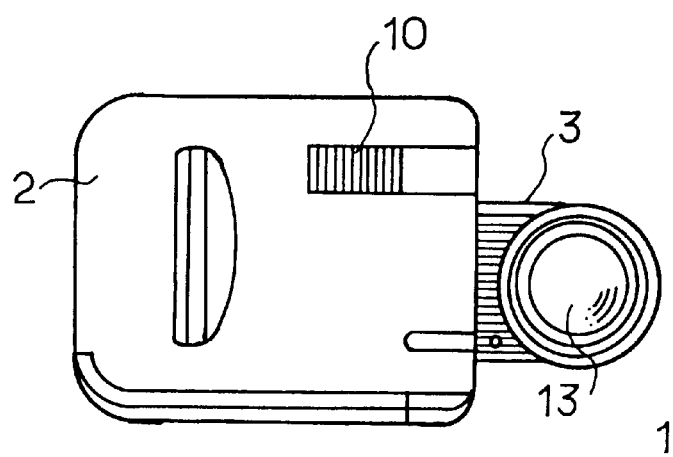
FIGS. 2(a) and 2(b) are a front view and a side view of the apparatus in a photographing operation respectively.
Figure 2:
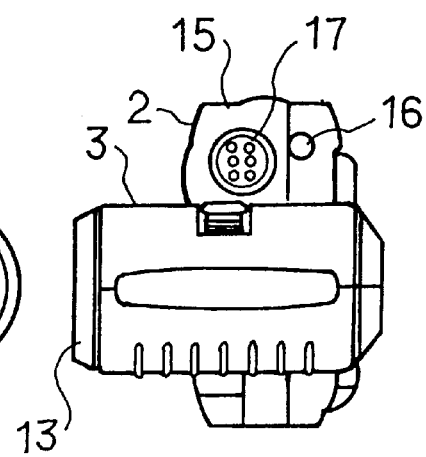

In the above-described digital camera 1, the lens unit 3 is paralleled to the body 2 as shown in FIG. 1, when the digital camera 1 is not in use. The camera can be used for photographing by rotating the lens unit 3 for 90 degrees as shown in FIG. 2. It is also possible to use the camera 1 in a state that the lens unit 3 is stopped somewhere between the positions shown in FIG. 1 and 2. Moreover, the camera can also be used by rotating the lens unit 3 for 180 degrees (such as the case of self-timer photography). The image in the LCD monitor 4 is appropriately changed over depending on the condition so as to display an erect image. As shown in FIG. 2, external connecting terminals such as a direct-current (DC) power source input terminal 16 and a digital input/output I/O terminal 17 are arranged on the side surface 15 of the body 2, so a DC power source and an external device such as a computer for an image processing can be connected thereto. Conventionally, there has been difficulty in designing to obtain a space for mounting the external connection terminals as the body 2 has become miniaturized. However, this difficulty can be overcome when the side surface 15 of the body 2 is used for mounting the external connection terminals as described above.

When the lens unit 3 is rotated relative to the body 2, the flexible circuit 42 surrounds the circumference of the extension part 40, so it is not twisted. Therefore, it is possible to secure the restoring force regardless of a lapse of time. Moreover, the card connector 27 has the installation parts 28, 29, 51, and 52 for installing the card holder body 27b at a predetermined distance apart from the printed circuit board 23. Installation parts 28, 29, 51, and 52 are arranged inside the projected area of the card holder body 27b, so that the card connector 27 does not interfere with the mounted parts in a miniaturized body 2. Further, since the card holder body 27b is installed at a predetermined distance, apart from the printed circuit board 23, the mounting space for the printed circuit board 23 can be efficiently used.

Figure 8A:
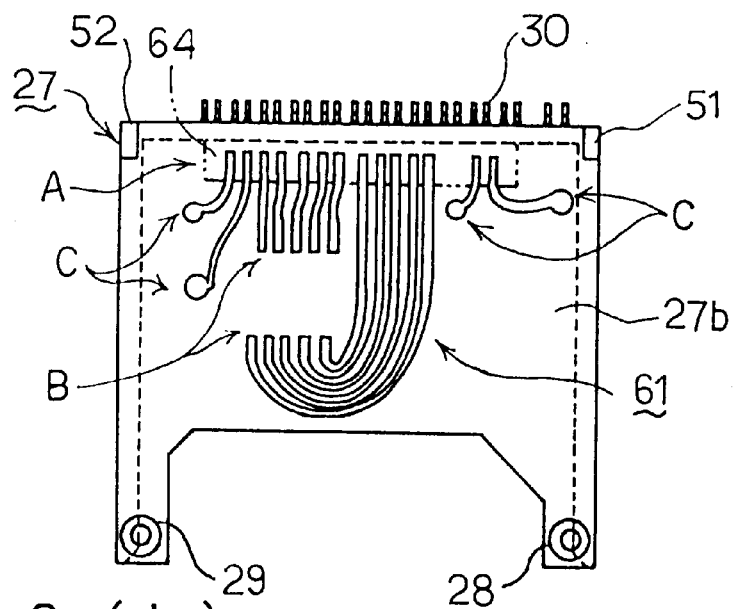
FIGS. 8(a), 8(b) and 8(c) are a bottom view, a front view and a side sectional view of a card connector according to another embodiment of the present invention respectively.
Figure 8B:
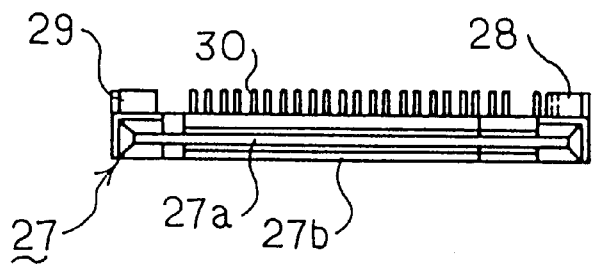
Figure 8C:
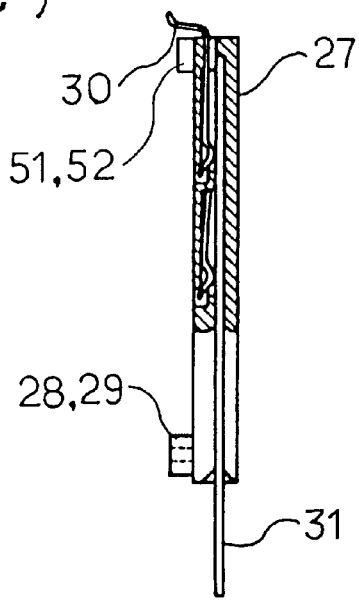
Figure 9:
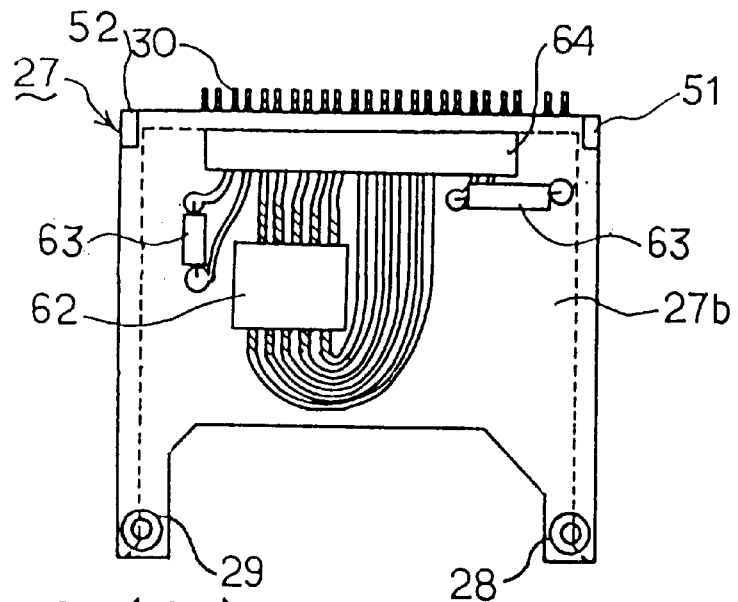
FIGS. 9(a), 9(b) and 9(c) are respectively a bottom view, a front view and a side sectional view of the card connector on which electronic parts are mounted.
Figure 9:
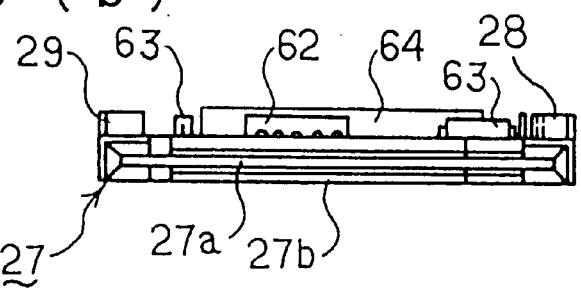
Figure 9:
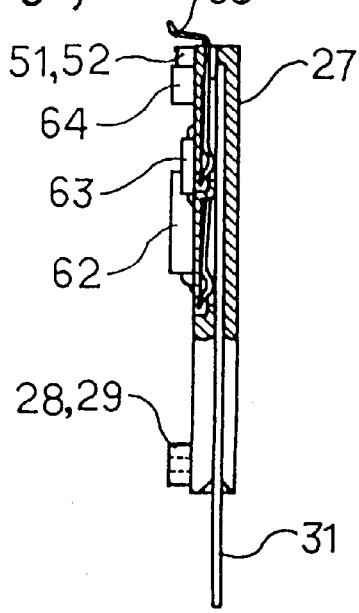

Now, another embodiment of the present invention will be explained as follows. FIGS. 8(a), 8(b) and 8(c) are a bottom view, a front view and a side sectional view of the card connector 27. FIGS. 9(a), 9(b) and 9(c) are a bottom view, a front view and a side sectional view of the card connector 27 be which electronic parts are mounted. The card connector 27 has a wiring pattern 61 on its bottom side, upon which electronic parts are mounted. In the wiring pattern 61 in the figure, "A" designates a zone for contacts for connecting with the printed circuit board 23 located on the body 2, "B" designates a zone for connecting an integrated circuit 62, and "C" designates a zone for connecting chips 63. The wiring pattern 61 and the printed circuit board 23 are electrically connected with each other by an anisotropy conductive rubber 64 (hereinafter referred to as conductive rubber). The conductive rubber 64 is attached to the printed circuit board 23, where the same conductive pattern as zone A is formed. The conductive rubber 64 is thicker than the distance between the printed circuit board 23 and the card connector 27, and is compressed by fixing the card connector 27, which maintains the electrical connection between the conductive pattern on the printed circuit board 23, and the wiring pattern 61 to the bottom surface of the card connector 27.

Due to the above-mentioned structure, an area between the card connector 27 and the printed circuit board 23 can be increased for mounting electrical parts, so that the space can be efficiently used.

It is to be understood that this invention may be embodied in several forms without departing from the spirit of essential characteristics thereof. For example, in the above-discussed embodiments, the rotational member 35 is supported by the bearing of the bearing plate 33 which is arranged on the side 15 of the body 2, so that the lens unit 3 can be rotated, attached and removed for the body 2. However, as from the relation between the bearing and the bearing plate, their function can be replaced by the other. Further, although the shaft part and the extension part are formed by the structure consists of a plurality of members in order to regulate the shaft movement in the shaft direction in the above-mentioned embodiments, it may be also possible to arrange some other member for regulating the movement in the shaft direction, and form the shaft member and the extension member as an integrated member. Moreover, the flexible circuit which vertically extends from the extension part to the shaft is not needed to surround the whole circumference of the extension member. What is needed is for the flexible circuit to have enough length for the rotating movement of the notched part of the extension member.

What is claimed is:

1. A card connector, comprising:

a card holder body, which has a card insertion slot into which a card is inserted, to support an inserted card; and, installation parts with which the card holder body is installed relative to a receiving structure to maintain a space between the card holder body and such receiving structure, wherein the installation parts are arranged inside a projected area of the card holder body.

2. A card connector as claimed in claim 1, wherein at least two installation parts each have at least one fastener aperture.

3. A card connector as claimed in claim 2, further comprising:

electrical contacts to make contact with a terminal of a card supported by the card connector.

4. A card connector as claimed in claim 3, further comprising:

a wiring circuit pattern, arranged on an outer surface of the card holder body, to receive electrical parts.

5. An electronic apparatus, comprising:

a body;

a printed circuit board which is connected to the body and upon which electrical parts are mounted;

a card connector, having a card insertion slot to receive a card and thereafter support an inserted card;

installation parts which are formed unitedly with the card connector, and with which the card connector is installed to maintain a space between the card holder body and the printed circuit board, wherein at least two installation parts each have at least one fastener aperture; and at least one fastening member which engages a fastener aperture of the installation parts and passes through the printed circuit board.

6. An electronic apparatus as claimed in claim 5, wherein the card connector has electrical contacts, one end of which makes contact with a terminal of an inserted card supported by the card connector, and another end is connected to the printed circuit board.

7. An electronic apparatus as claimed in claim 5, wherein the card connector has a wiring circuit pattern on its outer surface to receive further electrical parts.

8. A method for connecting a card connector to a structure, comprising following steps:

providing a card connector having installation parts formed, wherein at least two installation parts each have at least one fastener aperture;

positioning the card connector relative to a structure, wherein the installation parts create a space therebetween; and, securing the card connector to the structure using at least one fastening member to engage at least one fastener aperture.

9. A method for connecting a card connector to a structure as claimed in claim 8, further comprising the step of: electrically connecting the card connector and the structure.

10. A method for connecting a card connector to a structure as claimed in claim 9, wherein the step of electrically connecting the card connector and the structure includes connecting electrical contacts that engage the card connector with a wired circuit pattern formed on the structure.

11. A card connector for positioning adjacent to a structure, the card connector comprising:

a card holder body which has a card insertion slot to receive and support a card;

installation parts with which the card holder body is installed relative to the structure to maintain a space therebetween, wherein the installation parts are arranged inside a projected area of the card holder body.

12. The card connector as claimed in claim 11, wherein at least two installation parts each have an aperture.

13. The card connector as claimed in claim 12, wherein at least one fastening member engages an installation part, passing through the structure.

14. A card connector, comprising:

a card holder body, that has a card insertion slot into which a card is inserted, to support an inserted card parallel to a receiving structure; and installation parts with which the card holder body is installed relative to the receiving structure to maintain a space between the card holder body and such receiving structure, wherein the installation parts are arranged inside a projected area of the card holder body.

15. A card connector as claimed in claim 14, wherein at least two installation parts each have at least one fastener aperture.

16. A card connector as claimed in claim 15, further comprising:

electrical contacts to make contact with a terminal of a card supported by the card connector.

17. A card connector as claimed in claim 16, further comprising:

a wiring circuit pattern, arranged on an outer surface of the card holder body, to receive electrical parts.

18. An electronic apparatus, comprising:

a body;

a printed circuit board that is connected to the body;

a card connector, having a card insertion slot to receive a card and thereafter support an inserted card parallel to the printed circuit board;

installation parts that are formed unitedly with the card connector, and with which the card connector is installed to maintain a space between the card connector and the printed circuit board, wherein at least one installation part has a fastener aperture, wherein the fastener aperture and the inserted card overlap one another; and a fastening member which engages the fastener aperture of the installation part and passes through the printed circuit board.

* * * * *

UNITED STATES PATENT AND TRADEMARK OFFICE
CERTIFICATE OF CORRECTION

PATENT NO. : 6,053,745
DATED : April 25, 2000
INVENTOR(S) : Akio Miyata and Toshiyasu ITO It is certified that error appears in the above-indentified patent and that said Letters Patent is hereby corrected as shown below:

On the title page, item [54], delete "CARD CONNECTOR AND HOLDER SPACE PRODUCING FEATURES AND AN ELECTRONIC APPARATUS HAVING THE SAME", and insert --CARD CONNECTOR AND HOLDER HAVING SPACE PRODUCING FEATURES AND AN ELECTRONIC APPARATUS HAVING THE SAME--.

On the title page, item [73] Assignee:, after "Minolta Co., Ltd., Osaka, Japan", insert --; Yamaichi Electronics Co., Ltd., Tokyo, Japan--."

Signed and Sealed this

Twentieth Day of March, 2001

Attest:

NICHOLAS P. GODICI

*Attesting Officer*    *Acting Director of the United States Patent and Trademark Office*